(12) United States Patent
Greene et al.

(10) Patent No.: US 11,990,508 B2
(45) Date of Patent: May 21, 2024

(54) DUAL STEP ETCH-BACK INNER SPACER FORMATION

(71) Applicant: INTERNATIONAL BUSINESS MACHINES CORPORATION, Armonk, NY (US)

(72) Inventors: Andrew M. Greene, Slingerlands, NY (US); Yao Yao, Albany, NY (US); Ruilong Xie, Niskayuna, NY (US); Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 387 days.

(21) Appl. No.: 17/405,455

(22) Filed: Aug. 18, 2021

(65) Prior Publication Data

US 2021/0384296 A1    Dec. 9, 2021

Related U.S. Application Data

(62) Division of application No. 16/534,556, filed on Aug. 7, 2019, now Pat. No. 11,139,372.

(51) Int. Cl.
*H01L 29/06* (2006.01)
*H01L 29/16* (2006.01)
(Continued)

(52) U.S. Cl.
CPC ...... *H01L 29/0669* (2013.01); *H01L 29/0653* (2013.01); *H01L 29/16* (2013.01); *H01L 29/66666* (2013.01); *H01L 29/7827* (2013.01)

(58) Field of Classification Search
CPC ............. H01L 29/0669; H01L 29/0653; H01L 29/0673; H01L 29/0847; H01L 29/16;
(Continued)

(56) References Cited

U.S. PATENT DOCUMENTS 9,461,114 B2   10/2016   Obradovic et al.
9,773,886 B1    9/2017   Palle et al.
(Continued)

FOREIGN PATENT DOCUMENTS

CN            105679827          6/2016

OTHER PUBLICATIONS

List of IBM Patents or Patent Applications Treated as Related dated Aug. 18, 2021, 2 pages.
Authors Disclosed Anonymously, "Dual Stage Inner Spacer formation for Nanosheet-FET", IP.com No. IPCOM000253328D, IP.com Electronic Publication Date: Mar. 22, 2018.

*Primary Examiner* — Moazzam Hossain
(74) *Attorney, Agent, or Firm* — Tutunjian & Bitetto, P.C.; Robert Richard Aragona

(57) ABSTRACT

Semiconductor devices and methods of forming the same include recessing sacrificial layers in a stack of alternating sacrificial layers and channel layers using a first etch to form curved recesses at sidewalls of each sacrificial layer in the stack, with tails of sacrificial material being present at a top and bottom of each curved recess. Dielectric plugs are formed that each partially fill a respective curved recess, leaving exposed at least a portion of each tail of sacrificial material. The tails of sacrificial material are etched back using a second etch to expand the recesses. Inner spacers are formed in the expanded recesses.

20 Claims, 8 Drawing Sheets

(51) Int. Cl.
*H01L 29/66* (2006.01)
*H01L 29/78* (2006.01)

(58) Field of Classification Search
CPC ............. H01L 29/165; H01L 29/42392; H01L 29/66636; H01L 29/66439; H01L 29/66553; H01L 29/66545; H01L 29/6656; H01L 29/66666; H01L 29/66795; H01L 29/6681; H01L 29/775; H01L 29/7827; H01L 29/7848; H01L 29/785; H01L 29/78612; H01L 29/78654; H01L 29/0665–068; H01L 21/02601–02606; H01L 21/3142; H01L 29/6653; H01L 21/28141; H01L 21/28132–2815; H01L 21/823468; H01L 21/823864; H01L 29/0661; H01L 29/6634; H01L 21/306–3088; H01L 21/31111; B82Y 10/00
See application file for complete search history.

(56) References Cited

U.S. PATENT DOCUMENTS

| | | | |
|---|---|---|---|
| 9,954,058 | B1 | 4/2018 | Mochizuki et al. |
| 9,972,542 | B1 | 5/2018 | Bi et al. |
| 10,008,583 | B1 | 6/2018 | Rodder et al. |
| 10,014,390 | B1 | 7/2018 | Bouche et al. |
| 10,037,885 | B2 | 7/2018 | Doris et al. |
| 2016/0020305 | A1* | 1/2016 | Obradovic .......... H01L 27/0688 438/157 |
| 2016/0172358 | A1* | 6/2016 | Hatcher ................ H01L 29/775 257/401 |
| 2018/0047853 | A1 | 2/2018 | Chang et al. |
| 2018/0197794 | A1 | 7/2018 | Kang et al. |
| 2018/0315828 | A1 | 11/2018 | Yamashita et al. |
| 2019/0058052 | A1 | 2/2019 | Frougier et al. |
| 2020/0227534 | A1* | 7/2020 | Chiang ............... H01L 21/0245 |

* cited by examiner

US 11,990,508 B2

DUAL STEP ETCH-BACK INNER SPACER FORMATION

BACKGROUND

The present invention generally relates to semiconductor device fabrication and, more particularly, to the fabrication of nanosheet devices with robust inner spacers.

The formation of inner spacers in nanosheet devices, particularly those where a sacrificial material is formed between layers of channel material, can be complicated by the diffusion of material from the sacrificial layers and into the channel layers. Etching back the sacrificial material to make room for inner spacers can then be imperfectly selective, removing mixed material at a rate between the removal rates of the sacrificial material and the channel material. Structurally, this can result in a curved profile for the inner spacer, with some portions of the inner spacer being thinner than others.

During removal of the sacrificial material, the thinner portions of the curved inner spacer provide less protection. This can result in etchant reaching the source/drain structures and damaging those structures, causing voids.

SUMMARY

A method of forming a semiconductor device includes recessing sacrificial layers in a stack of alternating sacrificial layers and channel layers using a first etch to form curved recesses at sidewalls of each sacrificial layer in the stack, with tails of sacrificial material being present at a top and bottom of each curved recess. Dielectric plugs are formed that each partially fill a respective curved recess, leaving exposed at least a portion of each tail of sacrificial material. The tails of sacrificial material are etched back using a second etch to expand the recesses. Inner spacers are formed in the expanded recesses.

A method of forming a semiconductor device includes forming a stack of alternating sacrificial layers and channel layers that includes a gradient of sacrificial material and channel material at the interface of each pair of layers. Sacrificial layers in the stack of alternating sacrificial layers and channel layers are recessed using a first etch to form curved recesses at sidewalls of each sacrificial layer in the stack, with tails of sacrificial material being present at a top and bottom of each curved recess. Dielectric plugs are formed that each partially fill a respective curved recess, leaving exposed at least a portion of each tail of sacrificial material. The tails of sacrificial material are etched back using a second etch to expand the recesses. Inner spacers are formed in the expanded recesses. Source/drain structures are grown from sidewalls of the channel layers. The sacrificial layers are etched away after forming the inner spacers, using a third etch that does not form voids in the source/drain structures due to being prevented from reaching the source/drain structures by the inner spacers. The dielectric plugs are etched away after forming the inner spacers.

A semiconductor device includes vertically stacked channel layers. Inner spacers are positioned between vertically adjacent pairs of the channel layers, each inner spacer having a middle portion that is thinner than a top and bottom portion. A gate stack is formed over, around, and between the stacked channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a dual-step etch-back process to form robust inner spacers. After sacrificial layers are etched back using a first selective etch, a plug is formed in the curved surface of the sacrificial layers. The plug protects the bulk of the sacrificial layers from a second selective etch that trims any portions of the sacrificial material that may have etched more slowly due to diffusion of material into the channel layers, and any portions of the channel layers that may have etched more quickly due to that diffusion. When the inner spacers are formed, they are formed without substantial thinning at the top and bottom, resulting in superior protection for the source and drain regions when the sacrificial layers are later etched away.

Figure 1:
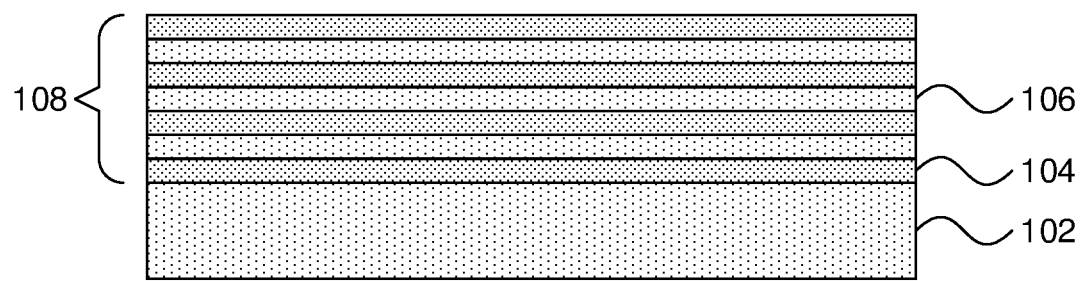
FIG. 1 is a cross-sectional diagram of a step in the formation of a nanosheet semiconductor device with robust inner spacers that shows a stack of alternating channel and sacrificial semiconductor materials in accordance with an embodiment of the present invention.

Referring now to the drawings in which like numerals represent the same or similar elements and initially to FIG. 1, a cross-sectional diagram of a step in forming nanosheet FETs with robust inner spacers is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate. In some embodiments, the stack of alternating layers 108 can be formed on a dielectric isolation layer (not shown) that electrically isolates the stack of alternating layers 108 from the underlying semiconductor substrate 102.

A stack of alternating semiconductor layers 108 is formed on the semiconductor substrate 102. The stack 108 may be formed directly on the semiconductor substrate 102 (as shown) or may, in alternative embodiments, be separated from the underlying substrate 102 by an isolation dielectric layer (not shown). Sacrificial layers 104 formed from a first material alternate with channel layers 106 formed from a second material. The first and second materials have etch selectivity with respect to one another. As used herein, the term "selective" in reference to a material removal process denotes that the rate of material removal for a first material is greater than the rate of removal for at least another material of the structure to which the material removal process is being applied.

The stack 108 may be formed from nanosheet layers of the respective materials. As used herein, a "nanosheet" is a sheet of material having a ratio between its thickness and its width of no less than 1:2. Although the present embodiments are specifically described with respect to nanosheet structures, it should be understood that nanowires, having a thickness-to-width ratio of 1:2 or less, may be used instead.

In one specific embodiment, the sacrificial layers 104 are formed from silicon germanium and the channel layers 106 are formed from silicon. More specifically, the sacrificial layers 104 may be formed from silicon germanium having a germanium concentration between about 20% and about 60%. Silicon and silicon germanium have imperfect etch selectivity with respect to one another, such that removing the material of one set of layers does result in the removal of some material from the other layers. It should be understood, however, that any appropriate combination of semiconductor materials having any reasonable degree of etch selectivity with respect to one another may be used instead.

The stack of alternating semiconductor layers 108 may be formed by any appropriate deposition process, including for example chemical vapor deposition (CVD), atomic layer deposition (CVD), physical vapor deposition (PVD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
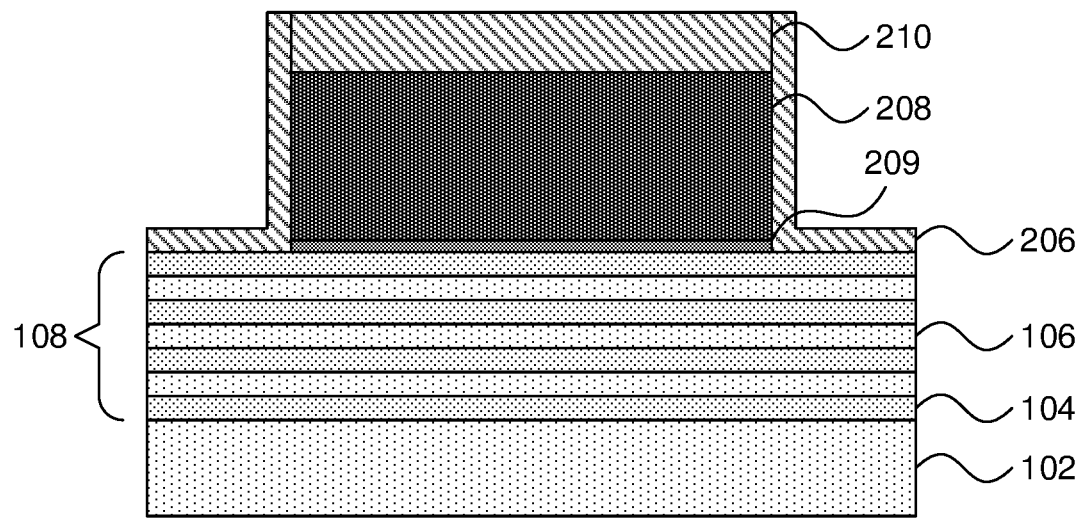
FIG. 2 is a cross-sectional diagram of a step in the formation of a nanosheet semiconductor device with robust inner spacers that shows the formation of a dummy gate on the stack of alternating layers in accordance with an embodiment of the present invention.

Referring now to FIG. 2, a cross-sectional diagram of a step in forming nanosheet FETs with robust inner spacers is shown. Dummy gate 208 is formed in the respective regions and may be formed from any appropriate material such as, e.g., polysilicon or amorphous silicon and are separated from the underlying stack of alternating semiconductor layers 108 by a dummy gate oxide 209. The dummy gate 208 is surrounded by an insulator layer formed from, e.g., a gate pattern hardmask 210 and a spacer 206. It is specifically contemplated that the gate pattern hardmask 210 may be formed from any appropriate hardmask material such as, e.g., silicon nitride, and that the spacer 206 may be formed from any appropriate dielectric material including, e.g., silicon nitride or silicon boron carbon nitride.

The dummy gate 208 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form the gate pattern hardmask 210. Next, the photoresist pattern is removed and the gate pattern is then transferred into the dummy gate material during an anisotropic selective etching process, such as reactive ion etching (RIE). Alternatively, the dummy gate 208 can be formed by other patterning techniques such as spacer image transfer.

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
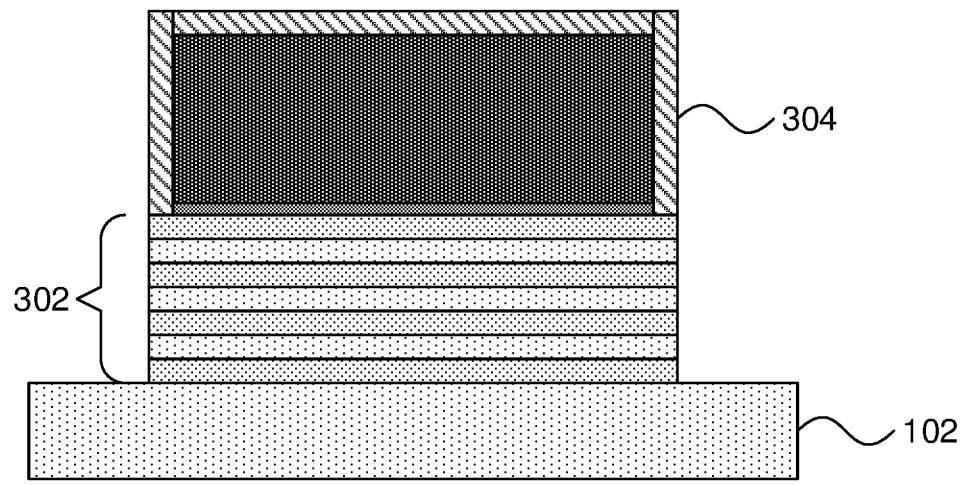
FIG. 3 is a cross-sectional diagram of a step in the formation of a nanosheet semiconductor device with robust inner spacers that shows etching into the stack around the dummy gate in accordance with an embodiment of the present invention.

Referring now to FIG. 3, a cross-sectional diagram of a step in forming nanosheet FETs with robust inner spacers is shown. An anisotropic etch is applied that stops on the substrate 102. The anisotropic etch should remove material from the spacer 206, such that it can penetrate to the underlying stack of layers 108, but should etch the stack of semiconductor layers 108 at a rate greater than the rate at which it etches the spacer 206 and the hardmask 210. This prevents the etch from damaging the dummy gate 208.

It is specifically contemplated that RIE may be used to perform the anisotropic etch. In one specific embodiment, multiple different etches may be used, with a first etch anisotropically removing material to remove material around the thicker gate pattern hardmask 206 and vertical spacer, followed by a second etch that is selective to the materials of the stack 108 without affecting the remaining hardmask materials. What remains is etched channel stacks 302 that extend no farther than the remaining gate spacers 304.

Figure 4:
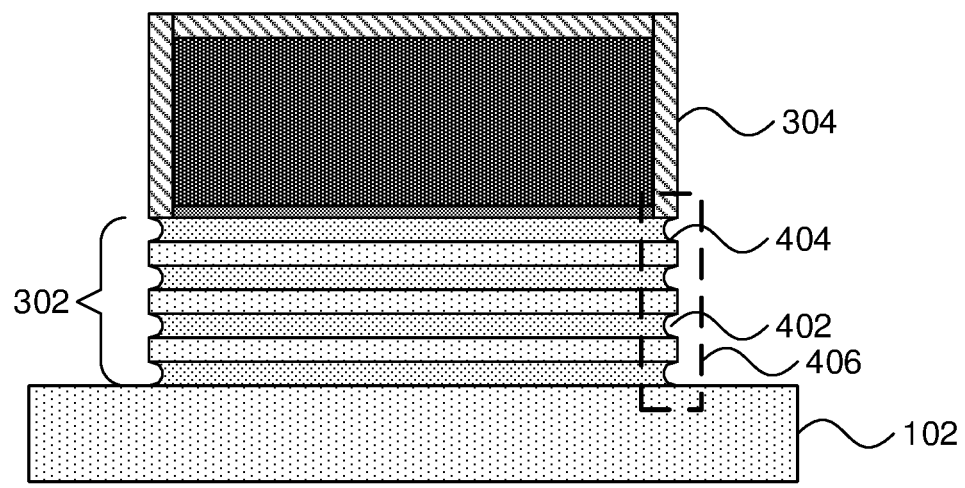
FIG. 4 is a cross-sectional diagram of a step in the formation of a nanosheet semiconductor device with robust inner spacers that shows recessing the sacrificial layers relative to the channel layers in accordance with an embodiment of the present invention.

Referring now to FIG. 4, a cross-sectional diagram of a step in forming nanosheet FETs with robust inner spacers is shown. A selective etch is performed that targets the material of the sacrificial layers 104. For example, in embodiments where the sacrificial material is silicon germanium and the channel material is silicon, a wet etch using, for example, a mixture of water, ammonia, and hydrogen peroxide can be used to selectively remove material that has a higher concentration of germanium. In general, a wet or dry chemical etch can be used to recess the sacrificial layers 104.

As noted above, however, this etch may have imperfect etch selectivity. Furthermore, the selectivity can be further frustrated by diffusion of germanium, or some other species, from the sacrificial material and into the channel material along the interface between the two materials. Such diffusion creates a gradient of germanium concentration across the interface. Because the selective etch removes material with higher concentrations of the diffused species faster than it removes material with lower concentrations of the diffused species, the recesses 402 that result from the etch will have a curved or otherwise sloped surface. Some material that includes the diffused species can remain at the tops and bottoms of the recesses 402, forming "tails" 404.

It should be noted that a more aggressive etch back, which is left to run for a longer period of time to remove the tails 404 within the recess, reduces the amount of sacrificial material that remains in the sacrificial layers 104. This results in shorter gate lengths and poor process control. The present embodiments instead remove the tails 404 using a second etch process. The region 406 is described in greater detail below.

Figure 5:
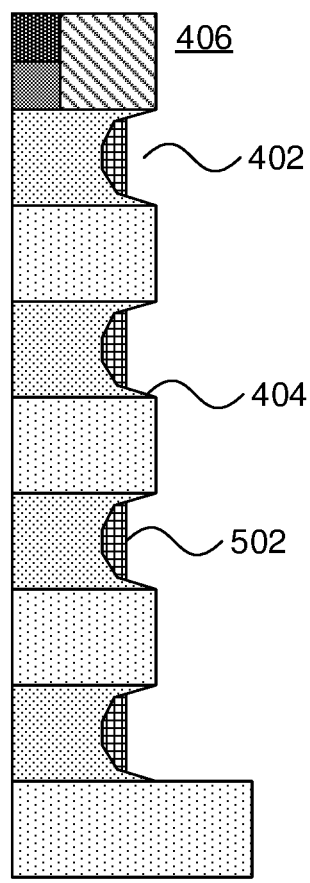
FIG. 5 is a cross-sectional diagram of a step in the formation of a nanosheet semiconductor device with robust inner spacers that shows additional detail on formation of dielectric plugs in the recesses of the sacrificial layers in accordance with an embodiment of the present invention.

Referring now to FIG. 5, additional detail of the region 406 of a cross-sectional diagram of a step in forming nanosheet FETs with robust inner spacers is shown. The recesses 402 are first filled with a dielectric material using a conformal deposition process such as, e.g., CVD or ALD. The dielectric material is then partially etched back using, e.g., a timed isotropic etch that leaves dielectric plugs 502 in the recesses 402. At least a portion of the tails 404 is left exposed by the dielectric plugs 502.

Figure 6:
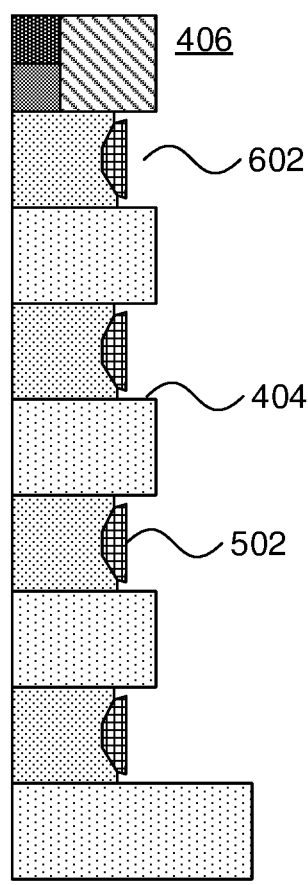
FIG. 6 is a cross-sectional diagram of a step in the formation of a nanosheet semiconductor device with robust inner spacers that shows additional detail on etching back tails of the sacrificial layers in accordance with an embodiment of the present invention.

Referring now to FIG. 6, additional detail of the region 406 of a cross-sectional diagram of a step in forming nanosheet FETs with robust inner spacers is shown. A second recessing etch is performed, further recessing the sacrificial layers 104 relative to the channel layers 106. Because the dielectric plugs 502 protects the most deeply etched portions of the sacrificial layers 104, only the tails 404 are exposed to the etch. The second etch can be performed for as long as is needed to remove the tails 404, because the bulk of the sacrificial layers 104 will not be harmed. It should be noted that the second etch can use the same etch chemistry as the first recess etch or can, alternatively, use a different etch chemistry that maintains etch selectivity between the channel material and the sacrificial material.

It should be noted that some embodiments may etch back past the outer surface of the dielectric plugs 502, while other embodiments do not fully remove the tails 404. As long as the thinnest portions of the tails 404—those closest to the exposed sidewalls of the channel layers 106—are removed, the inner spacers will be able to provide robust protection during subsequent processing steps.

Figure 7:
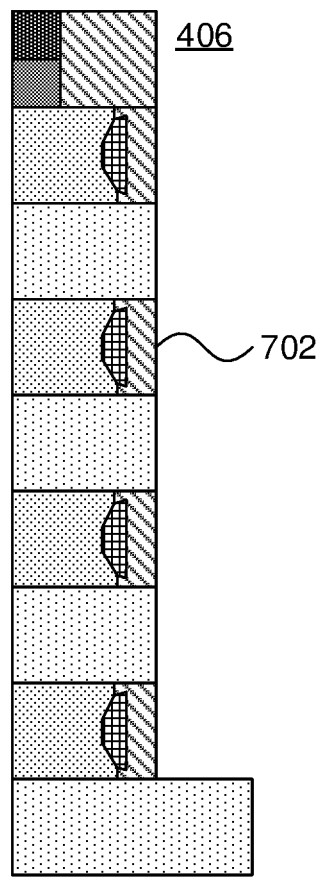
FIG. 7 is a cross-sectional diagram of a step in the formation of a nanosheet semiconductor device with robust inner spacers that shows additional detail on the formation of inner spacers in accordance with an embodiment of the present invention.

Referring now to FIG. 7, additional detail of the region 406 of a cross-sectional diagram of a step in forming nanosheet FETs with robust inner spacers is shown. Inner spacers 702 are formed by, e.g., conformally depositing a dielectric material and then anisotropically etching away any of the dielectric material that is not protected within the recesses 402. Notably, the inner spacers 702 are shown as extending past an outer surface of the dielectric plugs 502. In other embodiments, where the tails 404 are not fully etched away, the inner spacers 702 may not reach the depth of the outer surface of the dielectric plugs 502 at their top and bottom surfaces.

Notably, in some embodiments, the inner spacers 702 include a middle region that is thinner than a top and bottom region. The thicker portions are those portions that fill in gaps left behind by etching away the tails 404. This produces a stepped profile for an inner surface of the inner spacers 702, with an abrupt transition between the thinner middle portion and the thicker top and bottom portions.

Figure 8:
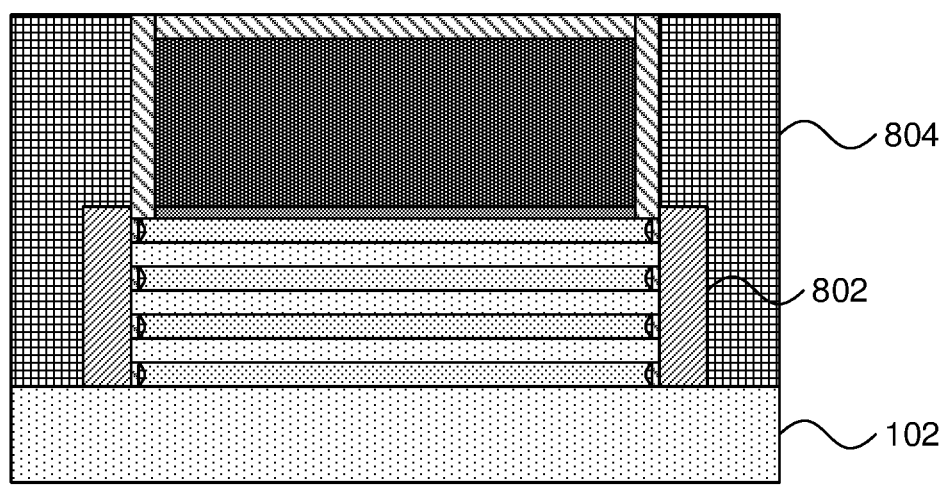
FIG. 8 is a cross-sectional diagram of a step in the formation of a nanosheet semiconductor device with robust inner spacers that shows the formation of source and drain regions in accordance with an embodiment of the present invention.

Referring now to FIG. 8, a cross-sectional diagram of a step in forming nanosheet FETs with robust inner spacers is shown. Source and drain structures 802 are grown from respecting ends of the channel layers 106. In some embodiments, the source/drain structures 802 may be formed by epitaxially growing semiconductor material from the exposed ends of the recessed channel layers 602. An interlayer dielectric 804 is deposited over and around the source/drain structures 802 and is then polished down to the level of the gate pattern hardmask 210 using, e.g., a chemical mechanical planarization (CMP) process. The interlayer dielectric 804 can be formed from any appropriate dielectric material such as, e.g., silicon dioxide.

The term "epitaxial growth" herein refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Source/drain epitaxy can be performed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial semiconductor materials can be doped during deposition (in situ doped) by adding dopants, such as n-type dopants (e.g., phosphorus or arsenic) or p-type dopants (e.g., boron or gallium), depending on the type of transistor. The dopant concentration in the source/drain can range from—about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$.

CMP is performed using, e.g., a chemical or granular slurry and mechanical force to gradually remove upper layers of the device. The slurry may be formulated to be unable to dissolve, for example, the gate pattern hardmask material, resulting in the CMP process's inability to proceed any farther than that layer.

Figure 9:
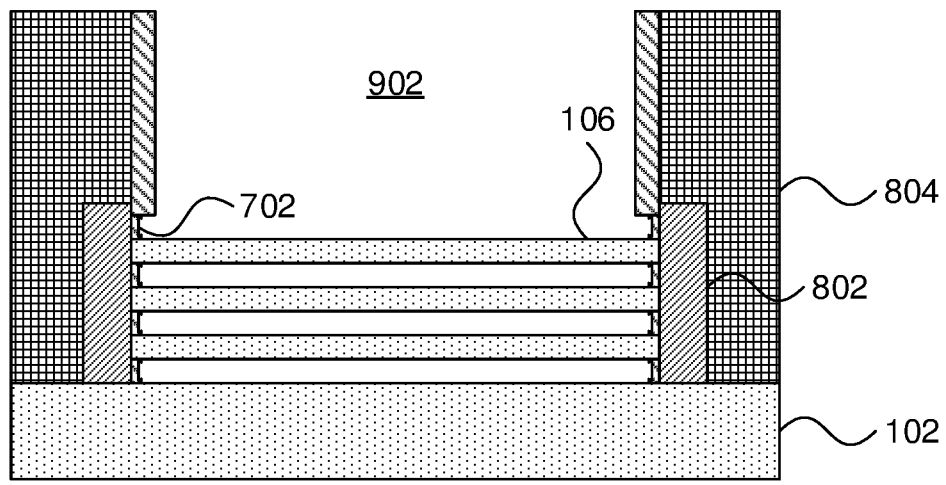
FIG. 9 is a cross-sectional diagram of a step in the formation of a nanosheet semiconductor device with robust inner spacers that shows the removal of the dummy gate and the sacrificial layers in accordance with an embodiment of the present invention.

Referring now to FIG. 9, a cross-sectional diagram of a step in forming nanosheet FETs with robust inner spacers is shown. The dummy gate pattern hardmask 210, the dummy gate 208, the dummy gate oxide 209, and the remaining sacrificial layers 104 are etched away using one or more etches that remove said structures selectively to the channel layers 106. This opens up a gap 902 that exposes the inner spacers 702. The dielectric plugs 502 are also etched away, leaving gaps at each inner spacer 702. Because the inner spacers 702 are not thinned in regions by the presence of sacrificial tails 404, the etch that removes the sacrificial layers 104 does not leave voids in the source/drain structures 802.

Figure 10:
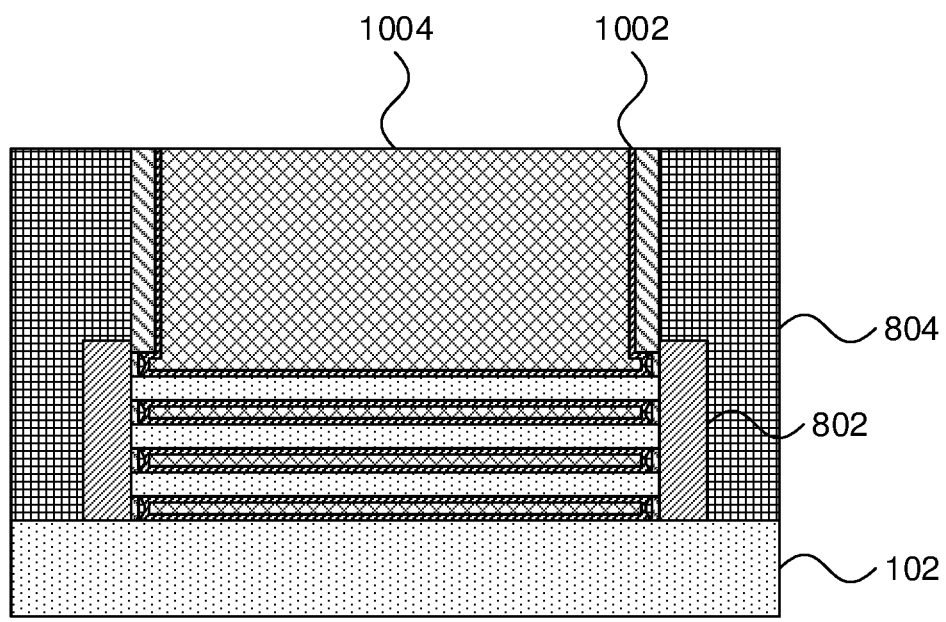
FIG. 10 is a cross-sectional diagram of a step in the formation of a nanosheet semiconductor device with robust inner spacers that shows the formation of a gate stack in accordance with an embodiment of the present invention.

Referring now to FIG. 10, a cross-sectional diagram of a step in forming nanosheet FETs with robust inner spacers is shown. A gate stack is formed that includes a gate dielectric 1002 and a gate conductor 1004. The gate dielectric 1002 can be conformally formed on and around the channel layers 106 and can be formed from any appropriate dielectric material. The gate conductor 1004 can be formed by any appropriate deposition process and fills the space 902 above, around, and between the channel layers 106.

In some embodiments, the gate dielectric layer 1002 can be formed from a high-k dielectric material, which is defined as a material having a dielectric constant that is greater than the dielectric constant of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 1004 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1004 may alternatively be formed from a doped semiconductor material such as, e.g., doped polysilicon.

Figure 11:
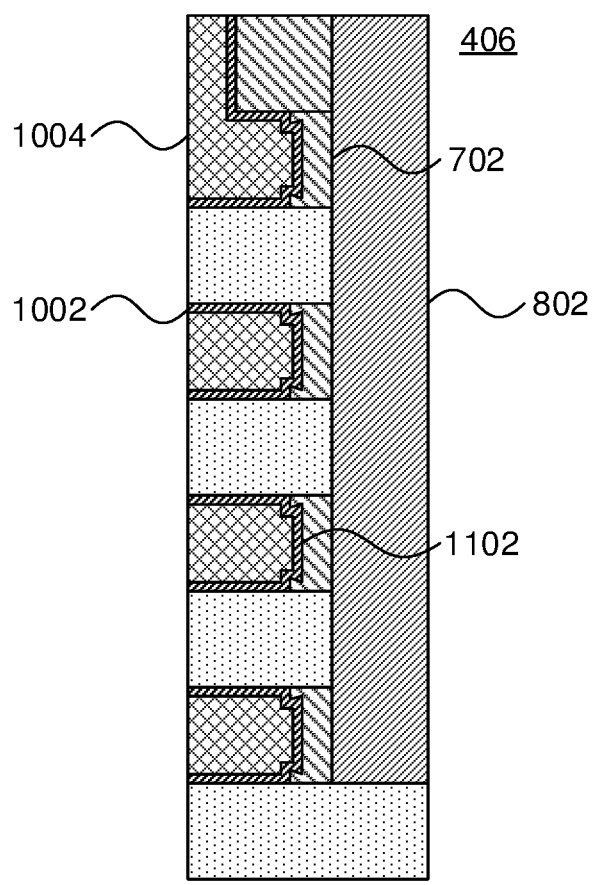
FIG. 11 is a cross-sectional diagram of a step in the formation of a nanosheet semiconductor device with robust inner spacers that shows additional detail on the formation of the gate stack in accordance with an embodiment of the present invention.

Referring now to FIG. 11, additional detail of the region 406 of a cross-sectional diagram of a step in forming nanosheet FETs with robust inner spacers is shown. This enlarged view shows the structure of the gate stack in greater detail, where a portion of the gate stack extends into a space defined by the inner spacers 702, where the dielectric plugs 502 were removed. The gate stack therefore includes extension portions 1102 at each inner spacer 702.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one elements or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it be the only layer between the two layers, one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
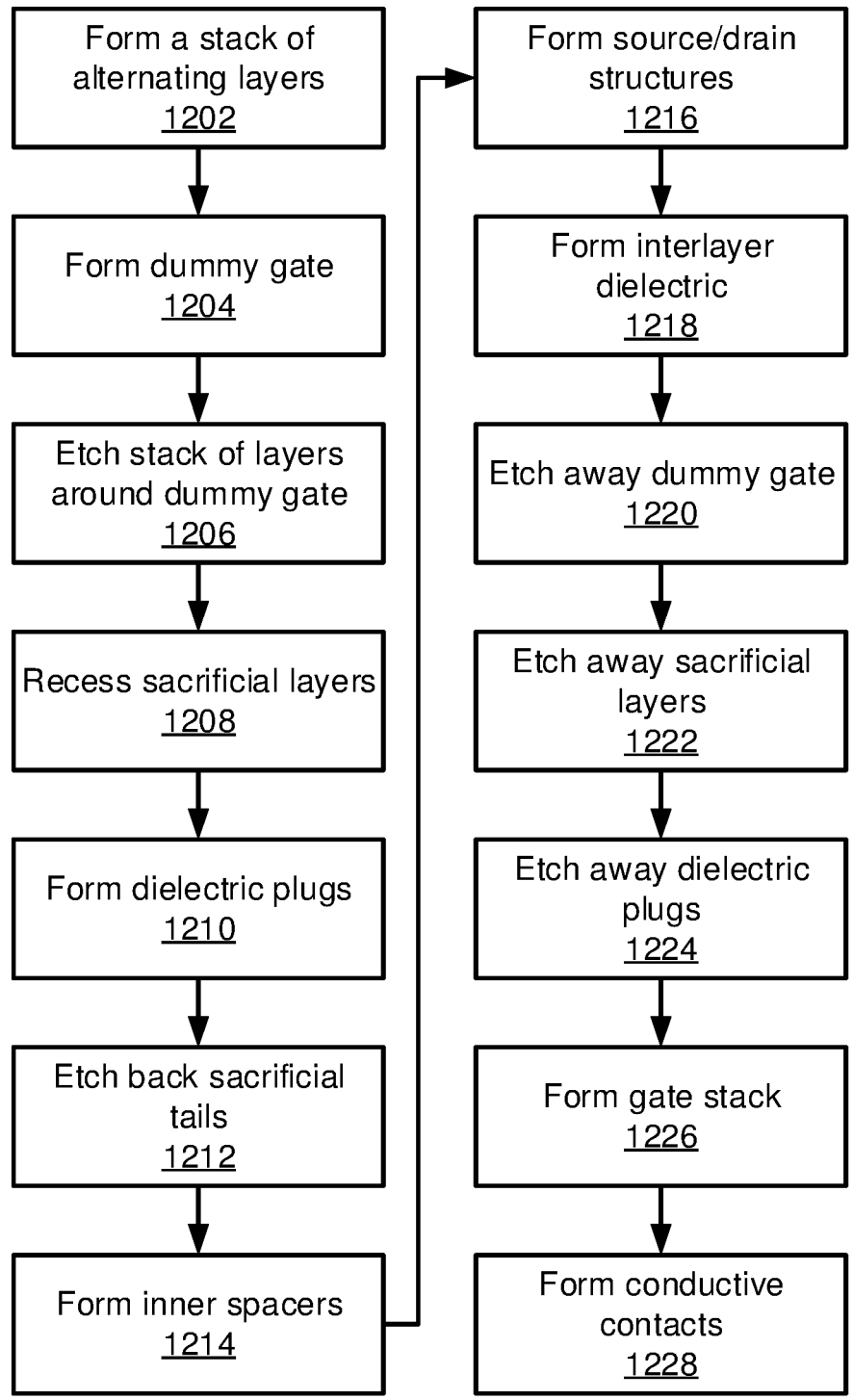
FIG. 12 is a block/flow diagram of a method of forming a nanosheet semiconductor device with robust inner spacers in accordance with an embodiment of the present invention.

Referring now to FIG. 12, a method of forming a device with robust inner spacers is shown. Block 1202 forms a stack 108 of alternating sacrificial layers 104 and channel layers 106. In some embodiments, the alternating layers can be formed from one another by epitaxially growing compatible materials in sequence. For example, the sacrificial material may be silicon germanium and the channel material may be silicon, because these two materials have compatible crystal structures. In some embodiments, a portion of the underlying substrate 102 can be replaced with an isolating dielectric layer (not shown).

Block 1204 forms a dummy gate 208 on the stack 108. The dummy gate can be any appropriate material and can be formed by patterning the material using a hardmask 210. Dummy gate sidewalls 304 can be formed by conformally depositing a hardmask material and anisotropically etching it away from horizontal surfaces. Block 1206 then uses the dummy gate 208 and the sidewalls 304 as a mask to etch down into the stack 108 to form stack of nanosheets 302.

Block 1208 performs a first recess of the sacrificial layers 104 using a selective etch. Because some material diffuses from the sacrificial layers and into the channel layers, this etch may be imperfect, leaving tails 404 of sacrificial material. In the example of using silicon germanium as the sacrificial material, some germanium can diffuse into the neighboring silicon channel layers 106, leaving a low-concentration silicon germanium at the interface between the two layers. Because the etch is selective to silicon germanium, and removes material at a speed that depends on the germanium concentration, the lower-concentration areas will be etched more slowly.

Block 1210 forms dielectric plugs 502 in the rounded recesses. This can be performed by conformally depositing dielectric material, such as silicon dioxide, and then etching back using an isotropic etch that leaves a portion of the dielectric material remaining, while exposing the tails 404. Block 1212 then etches back the sacrificial tails using a second selective etch, with the portions of sacrificial material behind the dielectric plugs 502 being protected from the second selective etch. Block 1214 forms inner spacers 702 by conformally depositing a dielectric material and then anisotropically etching away any of the dielectric material that is exposed outside of the recesses.

Block 1216 forms source/drain structures 802 by epitaxially growing semiconductor material from exposed sidewalls of the channel layers 106. Block 1218 forms interlayer dielectric 804 by any appropriate deposition process, such as a spin-on CVD of silicon dioxide. Block 1220 etches away the dummy gate 208, block 1222 etches away the sacrificial layers 104, and block 1224 etches away the dielectric plugs 502.

Block 1226 forms a gate stack over, around, and between the channel layers 104, including extensions 1102 that fit into divots in the inner spacers 802. Block 1228 then finishes the device by forming conductive contacts that make electrical contact with the gate conductor 1004 and the source and drain structures 802.

Having described preferred embodiments of dual step etch-back inner spacer formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a plurality of vertically stacked channel layers;
   inner spacers between vertically adjacent pairs of the channel layer, each inner spacer having a middle portion that is thinner than a top and bottom portion; and
   a gate stack formed over, around, and between the stacked channel layers.

2. The semiconductor device of claim 1, wherein the gate stack includes extended portions at each inner spacer that occupy a space defined by the thinner middle portion of the inner spacers.

3. The semiconductor device of claim 1, further comprising source and drain structures grown from respective sidewalls of the stacked channel layers.

4. The semiconductor device of claim 3, wherein the source and drain structures include no voids at the top and bottom portions of the inner spacers.

5. The semiconductor device of claim 1, wherein a side of the inner spacers that faces the gate stack has a stepped profile.

6. The semiconductor device of claim 5, wherein the gate stack includes a gate dielectric that is formed conformally on contours of the side of the inner spacers that faces the gate stack.

7. The semiconductor device of claim 6, wherein the gate stack includes a gate conductor and wherein the gate dielectric includes a stepped profile on a side that faces the gate conductor.

8. The semiconductor device of claim 1, wherein the inner spacers make direct contact with horizontal surfaces of the respective vertically adjacent pairs of the channel layers.

9. The semiconductor device of claim 1, further comprising a gate spacer on sidewalls of the gate stack, above the plurality of vertically stacked channel layers, wherein a top inner spacer is positioned between the gate spacer and a top channel layer of the plurality of vertically stacked channel layers.

10. A semiconductor device, comprising:
a plurality of vertically stacked channel layers;
inner spacers between vertically adjacent pairs of the channel layers, each inner spacer having stepped profile, with a middle portion that is thinner than a top and bottom portion; and
a gate stack formed over, around, and between the stacked channel layers, including a gate dielectric that is formed conformally on contours of the side of the inner spacers that faces the gate stack.

11. The semiconductor device of claim 10, wherein the gate stack includes extended portions at each inner spacer that occupy a space defined by the thinner middle portion of the inner spacers.

12. The semiconductor device of claim 10, further comprising source and drain structures grown from respective sidewalls of the stacked channel layers.

13. The semiconductor device of claim 12, wherein the source and drain structures include no voids at the top and bottom portions of the inner spacers.

14. The semiconductor device of claim 10, wherein the gate stack includes a gate conductor and wherein the gate dielectric includes a stepped profile on a side that faces the gate conductor.

15. The semiconductor device of claim 10, wherein the inner spacers make direct contact with horizontal surfaces of the respective vertically adjacent pairs of the channel layers.

16. The semiconductor device of claim 10, further comprising a gate spacer on sidewalls of the gate stack, above the plurality of vertically stacked channel layers, wherein a top inner spacer is positioned between the gate spacer and a top channel layer of the plurality of vertically stacked channel layers.

17. A semiconductor device, comprising:
a plurality of vertically stacked channel layers;
inner spacers between vertically adjacent pairs of the channel layers, each inner spacer having a stepped profile, with a middle portion that is thinner than a top and bottom portion, wherein the inner spacers make direct contact with horizontal surfaces of the respective vertically adjacent pairs of the channel layers; and
a gate stack formed over, around, and between the stacked channel layers, including a gate dielectric, which is formed conformally on contours of the side of the inner spacers that faces the gate stack, and a gate conductor, wherein the gate dielectric includes a stepped profile on a side that faces the gate conductor.

18. The semiconductor device of claim 17, wherein the gate stack includes extended portions at each inner spacer that occupy a space defined by the thinner middle portion of the inner spacers.

19. The semiconductor device of claim 17, further comprising source and drain structures grown from respective sidewalls of the stacked channel layers.

20. The semiconductor device of claim 19, wherein the source and drain structures include no voids at the top and bottom portions of the inner spacers.

\* \* \* \* \*